United States Patent [19]

Barsotti et al.

[11] Patent Number: 5,059,898
[45] Date of Patent: Oct. 22, 1991

[54] WAFER PROBE WITH TRANSPARENT LOADING MEMBER

[75] Inventors: Christina C. Barsotti, Vancouver, Wash.; Alfred H. Schamel, West Linn, Oreg.

[73] Assignee: Tektronix, Inc., Beaverton, Oreg.

[21] Appl. No.: 564,511

[22] Filed: Aug. 9, 1990

[51] Int. Cl.[5] .............................................. G01R 1/06
[52] U.S. Cl. ................................. 324/158 P; 324/72.5
[58] Field of Search ................ 324/158 P, 158 F, 72.5

[56] References Cited

U.S. PATENT DOCUMENTS

| | | | |
|---|---|---|---|
| 3,810,016 | 5/1974 | Chayka et al. | 324/158 P |
| 4,758,785 | 6/1988 | Rath | 324/158 P |
| 4,891,585 | 1/1990 | Janko et al. | 324/158 P |
| 4,912,399 | 3/1990 | Greub et al. | 324/158 P |
| 4,918,383 | 4/1990 | Huff et al. | 324/158 P |
| 4,943,768 | 7/1990 | Niki et al. | 324/158 F |
| 4,961,052 | 10/1990 | Tada et al. | 324/158 P |
| 4,963,821 | 10/1990 | Janko et al. | 324/158 F |

FOREIGN PATENT DOCUMENTS 0131375 1/1985 European Pat. Off. .
0259163 3/1988 European Pat. Off. .

Primary Examiner—Ernest F. Karlsen
Attorney, Agent, or Firm—John D. Winkelman; John Smith-Hill

[57] ABSTRACT

A probe head for establishing electrically conductive contact with an electronic device comprises a loading member having an attachment portion for attachment to a support structure. A cantilever arm is attached at a first end to the attachment portion and has a second end spaced from the attachment portion. A flexible sheet of insulating material is attached at a first end region to the second end of the cantilever arm with a first main face of the flexible sheet confronting the cantilever arm. A first array of contact elements is exposed at the second main face of the sheet at the first end region thereof, whereby the sheet of insulating material is between the cantilever arm and the contact elements of the first array. A second array of contact elements is exposed at a second end region of the sheet, spaced from the first end region, and conductor runs connect the contact elements of the first array with respective contact elements of the second array.

19 Claims, 3 Drawing Sheets

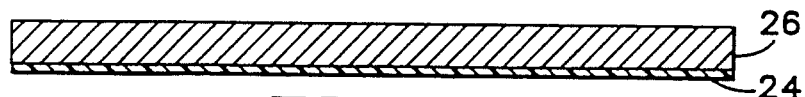
FIG. 2A
FIG. 2B
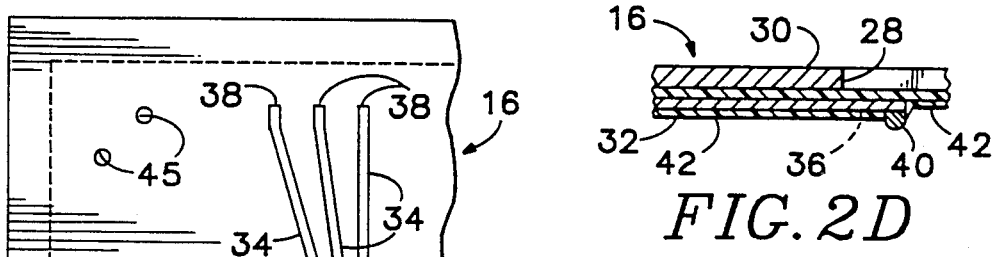
FIG. 2C
FIG. 2D
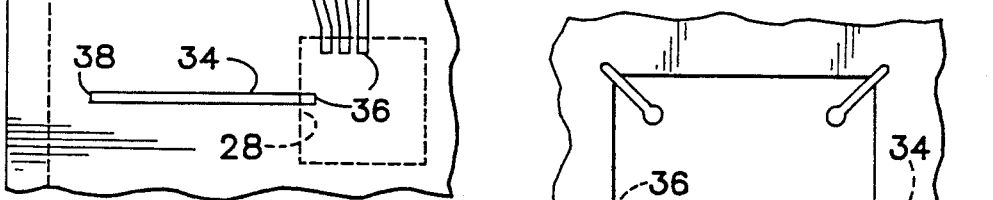
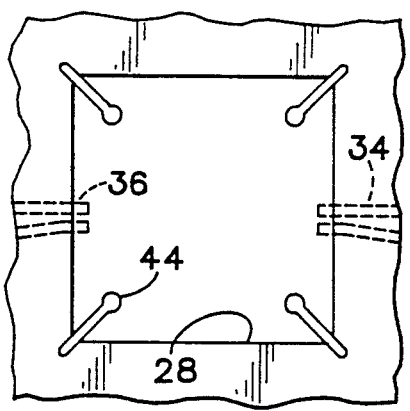
FIG. 2E
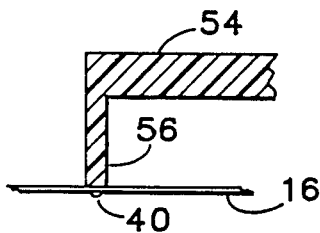
FIG. 2F
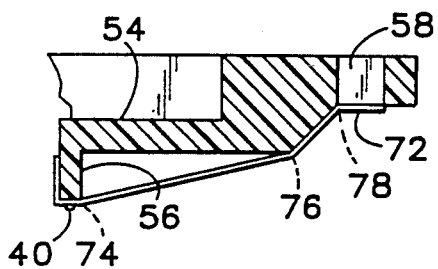
FIG. 2H
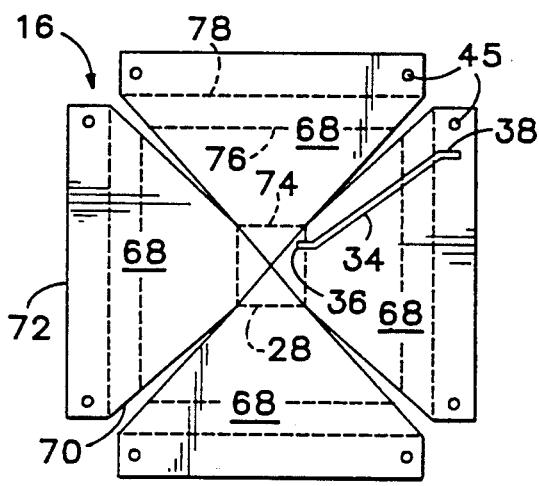
FIG. 2G

WAFER PROBE WITH TRANSPARENT LOADING MEMBER

BACKGROUND OF THE INVENTION

This invention relates to a wafer probe with a transparent loading member.

An important aspect of the manufacture of integrated circuit chips is the testing of the circuit embodied in the chip in order to verify that it operates according to specifications. Although the circuit could be tested after the chip has been packaged, the expense involved in dicing the wafer and packaging the individual chips makes it desirable to test the integrated circuit as early as possible in the fabrication process, so that unnecessary efforts will not be expended on faulty devices. It is therefore desirable that these circuits be tested after wafer fabrication is completed, and before separation into dies. In either case, it is necessary to make electrical connection to connection elements of the circuit in a non-destructive fashion, so as not to interfere with subsequent packaging and connection operations.

Generally, integrated circuit chips are rectangular and the connection elements are distributed around the periphery of one main face of the die. The connection elements are generally in the form of flat connection pads, but it is known to employ connection elements in the form of bumps, which may be hemispherical in form.

A conventional testing station for testing integrated circuits in wafer form comprises a vacuum chuck and a probe support. The vacuum chuck is positioned on a rigid base structure, and the probe support is located at a predetermined height above the base structure. The vacuum chuck includes a platform on which a wafer composed of integrated circuits to be tested is placed. The probe support is fixed against movement relative to the base structure, but the chuck is movable linearly along two perpendicular horizontal axes relative to the base structure (X and Y axis movement) and is rotatable about a vertical axis (theta movement), and the platform can be raised or lowered (Z axis movement). A wafer probe is carried by the probe support and has contact elements for engaging connection elements of a die under test (DUT). The contact elements of the wafer probe are generally hemispherical bumps if the connection elements of the die are flat pads and are contact pads if the connection elements of the die are hemispherical bumps. By displacing the chuck horizontally, the DUT can be positioned so that its connection elements are vertically below the contact elements of the probe and by raising the platform the connection elements of the die can be brought into contact with the contact elements of the probe.

It is important that the DUT be accurately positioned in the X-Y plane relative to the contact elements of the probe, so that the contact elements of the probe are engaged by the connection elements of the DUT when the wafer is raised by the vacuum chuck. Furthermore, in order to provide consistent test results it is necessary that the contact force between the connection elements of the die and the respective contact elements of the probe be substantially the same from die to die and from wafer to wafer.

Generally, it is only necessary to position one die of a wafer relative to the probe, because the relative positions of the dies on the wafer are accurately known and once the probe has been accurately positioned relative to one die, it can readily step to each of the other dies without operator intervention.

U.S. Pat. No. 4,912,399 issued Mar. 27, 1990 discloses a wafer probe that comprises a transparent flexible membrane. An operator can view the die on the vacuum chuck through the membrane and can insure that the contact elements of the probe are properly positioned relative to the connection elements of the die before the vacuum chuck is raised. Contact pressure is provided by a rigid pressure plate that extends over the membrane and resilient material between the membrane and the pressure plate.

U.S. Pat. No. 4,891,585 issued Jan. 2, 1990 discloses a wafer probe comprising a circuit board that spans an opening in the probe support and a transparent flexible membrane that spans an opening in the circuit board. Upward movement of the contact area of the membrane is limited in resiliently yieldable fashion by a back-up structure that comprises a hard pressure pad engaging the membrane, a rod of elastomer material and a plate that is secured to the probe support. The back-up structure is transparent, allowing an operator to view the contact elements of the probe and the connection elements of the die to be tested through the backup structure and the membrane.

U.S. Pat. No. 4,758,785 issued July 19, 1988 discloses a test station in which upward deflection of the flexible membrane is resisted by a metal spring that bears against the flexible membrane through a transparent pressure pad. The pressure pad carries the movable contact of a switch that controls vertical movement of the vacuum chuck. The stationary contact of the switch is mounted on the probe support. When the contact elements of the membrane are spaced from the connection elements of the die under test, the metal spring, acting through the pressure pad, deflects the membrane downwards and the movable contact of the switch engages the stationary contact. When force is applied to the contact elements of the probe such as to deflect the membrane upwards, this force is resisted in resiliently yieldable fashion by the metal spring. When the membrane has been deflected upwards by a predetermined amount, the movable contact of the switch leaves contact with the fixed contact and further upward movement of the vacuum chuck is prevented.

Publication no. EPA-A2-0,259,163 discloses a wafer probe that is similar in many respects to that shown in U.S. Pat. No. 4,758,785.

Publication No. EPA-A1-0,131,375 discloses a wafer probe in which probe supports, which are attached to a probe board, carry conductive probe elements for probing an integrated circuit die in wafer form.

SUMMARY OF THE INVENTION

According to a first aspect of the present invention there is provided a probe head for establishing electrically conductive contact with an electronic device, said probe head comprising a loading member having an attachment portion for attachment to a support structure and an elongate cantilever arm having first and second opposite ends spaced apart along the length thereof, the cantilever arm being attached at its first end to the attachment portion and the second end of the cantilever arm being spaced from the attachment portion, a flexible sheet of insulating material having first and second opposite main faces and first and second opposite end regions, the sheet being attached at its first end region to the second end of the cantilever arm with the first main face of the flexible sheet confronting the cantilever arm, a first array of contact elements exposed at the second main face of the sheet at the first end region thereof, whereby the sheet of insulating material is between the cantilever arm and the contact elements of the first array, a second array of contact elements exposed at the second end region of the sheet, and conductor runs connecting the contact elements of the first array with respective contact elements of the second array.

According to a second aspect of the present invention there is provided probe apparatus for establishing electrically conductive contact with an electronic device, said probe apparatus comprising a probe head and a probe support, and the probe head comprising a loading member having an attachment portion attached to the probe support and an elongate cantilever arm having first and second opposite ends spaced apart along the length thereof, the cantilever arm being attached at its first end to the attachment portion and the second end of the cantilever arm being spaced from the attachment portion, a flexible sheet of insulating material having first and second opposite main faces and first and second opposite end regions, the sheet being attached at its first end region to the second end of the cantilever arm with the first main face of the flexible sheet confronting the cantilever arm, a first array of contact elements exposed at the second main face of the sheet at the first end region thereof, whereby the sheet of insulating material is between the cantilever arm and the contact elements of the first array, a second array of contact elements exposed at the second end region of the sheet, and conductor runs connecting the contact elements of the first array with respective contact elements of the second array.

BRIEF DESCRIPTION OF THE DRAWINGS

For a better understanding of the invention and to show how the same may be carried into effect, reference will now be made, by way of example, to the accompanying drawings in which:

FIGS. 2A-2G illustrate fabrication of the probe head.

DETAILED DESCRIPTION

Figure 1:
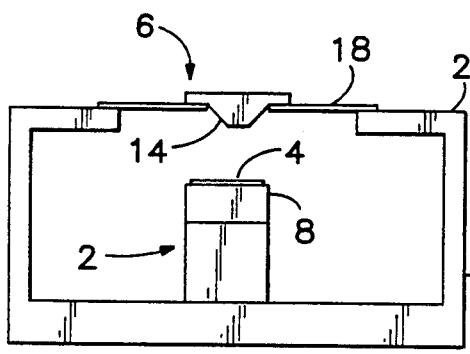
FIG. 1 is a schematic side view of a test station for wafer probing integrated circuit dies, the test station including a wafer probe comprising a probe head, a cover plate and an interface board.

The illustrated test station comprises a base structure 10, a vacuum chuck 2 for supporting a wafer 4 that includes multiple integrated circuit dies that are to be tested, a wafer probe 6 for making electrical contact to contact pads of a die under test, and a measurement instrument (not shown) for applying test signals to the die under test and receiving responses to the test signals from the die under test.

The vacuum chuck 2 is displaceable horizontally relative to base structure 10 along two mutually perpendicular axes under control of X and Y stepping motors (not shown) and is rotatable about a vertical axis, and includes a platform 8 that has a horizontal top surface and can be raised and lowered (Z-axis movement) relative to base structure 10. Wafer probe 6, which comprises a probe head 14, an interface board 18 and a cover plate 20, is supported relative to base structure 10 by a mounting structure 22 so as to remain stationary relative to base structure 10.

Probe head 14 comprises a composite membrane 16 that is manufactured from a sheet 24 (FIG. 2A) of polyimide about 0.25 microns thick having a thick layer 26 of copper deposited on its upper main face. In this description of the processing of sheet 24, it will be assumed that the orientation of the sheet remains constant. However, this is done for clarity and is not intended to imply that the orientation of the sheet might not be changed for various operations. Layer 26 is partially removed by selective etching to form a square opening 28 through which sheet 24 is exposed, surrounded by a layer 30 about 0.51 microns thick, which in turn is surrounded by a support frame 32 (FIG. 2B). Then, using conventional plating and photolithographic processes, multiple discrete conductor runs 34 are deposited on the lower main face of sheet 24. Representative conductor runs are shown in FIG. 2C. Each conductor run 34 extends from an inner end 36 that is within the periphery of the square opening 28 in the layer 30 to a contact pad 38 at an opposite outer end. A nickel contact bump 40 (FIG. 2D) is plated onto the inner end of each conductor run 34. A liquid film of polyimide is deposited over the lower main face of sheet 24 and holes are etched in the liquid film to expose bumps 40. The liquid film is then cured to form a cover sheet 42.

Laser cuts 44 are made in the composite membrane, as shown in FIG. 2E. These laser cuts are sufficiently short that they do not impair the dimensional stability of membrane 16. The purpose of the laser cuts will be explained below. Further, alignment holes 45 (FIG. 2C) are formed in the membrane at each corner.

Figure 3A:
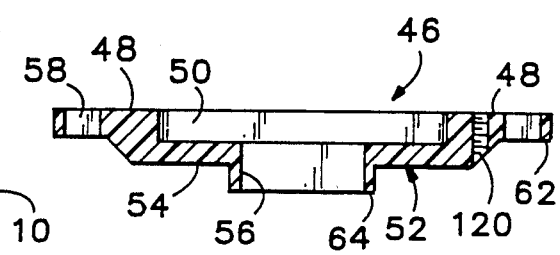
FIGS. 3A and 3B are, respectively, a sectional view and a partial bottom plan view of a loading member that forms part of the probe head.
Figure 3B:
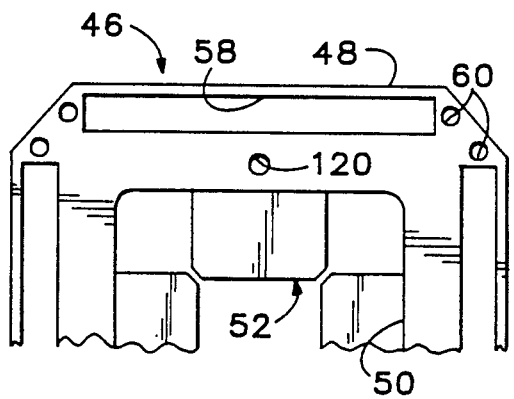

Probe head 14 further comprises a loading member 46 (FIGS. 3A and 3B) made of optically clear synthetic polymer material. The preferred polymer material is polycarbonate, which is selected because its mechanical properties are stable over a fairly wide range of temperatures. Loading member 46 comprises an outer frame 48 defining a substantially square opening 50, and cantilever arms 52 extending into the square opening from the outer frame.

Each cantilever arm 52 comprises a horizontal limb 54 and a vertical limb 56. The bottom end surfaces 64 of vertical limbs 56 are all coplanar and are optically clear. The upper surface of each horizontal limb 54 is optically clear at least over vertical limb 56.

Frame 48 is formed with a rectangular slot 58 along each side, and at each corner of outer frame 48 there are two alignment holes 60. The bottom surface of frame 48 is planar along its outer margin 62 and slopes downwardly toward the opening 50 inwardly of the flat outer margin.

Sheet 24 is positioned relative to loading member 46 so that the four rows of contact bumps 40 lie directly beneath the vertical limbs 56 of cantilever arms 52 respectively. This is accomplished by means of a fixture (not shown) having alignment pins that enter the alignment holes 45 of membrane 16 and the alignment holes 60 of loading member 46.

Membrane 16 is attached to loading member 46 by a film of optically clear pressure sensitive adhesive (not shown) provided along the bottom end surface of each vertical limb 56 of each cantilever arm 52 (FIG. 2F). After securing to the arms 52, membrane 16 is cut to the shape shown in FIG. 2G, so that it is divided into four distinct leaves 68. Each leaf 68 comprises a generally triangular inner portion 70 and a rectangular outer lip 72. It will be noted that the contact pads 38 are located on the lower surfaces of the outer lips 72 and that there are two alignment holes 45 in the lip 72 of each leaf. The laser cuts 40 shown in FIG. 2E facilitate cutting of the membrane into four leaves without risk of damage to the cantilever arms.

Referring now to FIGS. 2G and 2H, the leaves are folded along lines 74, 76 and 78 so that the upper surface of each triangular portion 70 is brought into contact with the sloping lower surface of the outer frame 48 of loading member 46 and the upper surface of lip 72 is brought into contact with the flat outer margin 62 of outer frame 48. A fixture is used to ensure that the alignment holes of each leaf register with the corresponding alignment holes of loading member 46. Pressure sensitive adhesive (not shown) is used to secure the leaves to frame 48. The region of sheet 24 exposed through the square opening 28 in layer 30 is divided into four triangular tongues, which are folded up and are bonded to the vertical limbs 56 of arms 52 by use of pressure sensitive adhesive (not shown).

Figure 4:
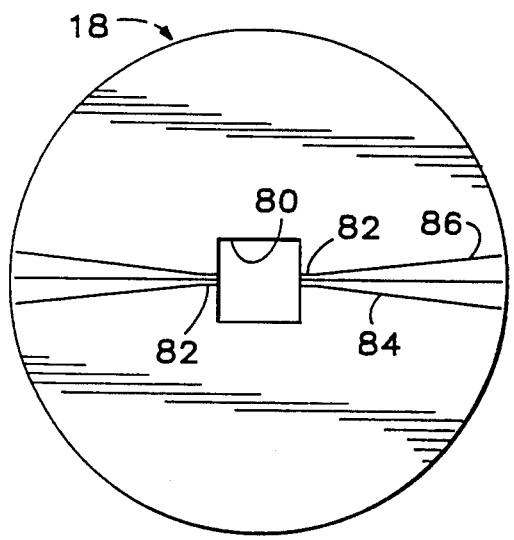
FIG. 4 is a top plan view of the interface board.

Interface board 18, which is shown in FIG. 4, is a substantially rigid etched circuit board that is attached to mounting structure 22 by screws (not shown). Board 18 has an array of inner contact pads 82 on its upper surface around the periphery of a square opening 80. Contact pads 82 are connected through conductor runs 84 to outer contact pads 86, which are connected to the test instrument through appropriate connectors (not shown). Representative contact pads 82, 86 and representative conductor runs 84 are shown in FIG. 5.

Figure 5:
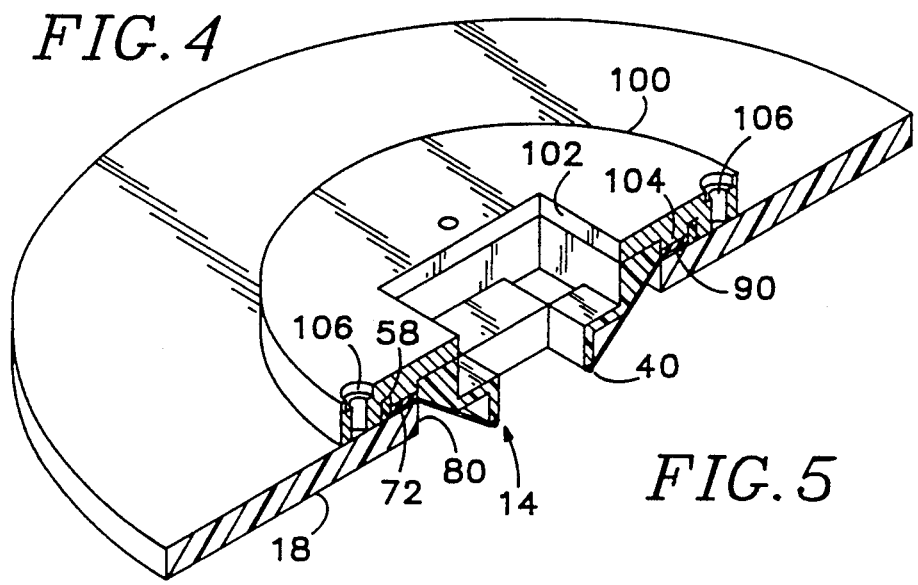
FIG. 5 is a sectional perspective view of the wafer probe.

Referring to FIG. 5, probe head 14 is positioned in the square opening 80 of interface board 18 by use of alignment pins (not shown) that project from the interface board and enter the alignment holes in membrane 16 and loading member 46. The lips 72 of leaves 68 overlie the margin of interface board 18 along the edge of opening 80. The pattern of contact pads 38 on lips 72 corresponds to the pattern of contact pads 82 on the upper surface of interface board 18, and the contact pads of the probe head engage respective contact pads of the interface board. Strips 90 of neoprene rubber or other resiliently deformable insulating material are placed in the slots 58, overlaying lips 72 respectively.

Figure 6A:
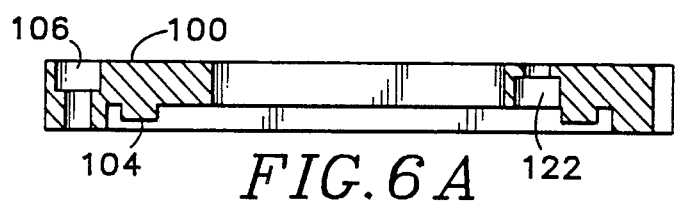
FIGS. 6A and 6B are, respectively, a sectional view and a bottom plan view of the cover plate.
Figure 6B:
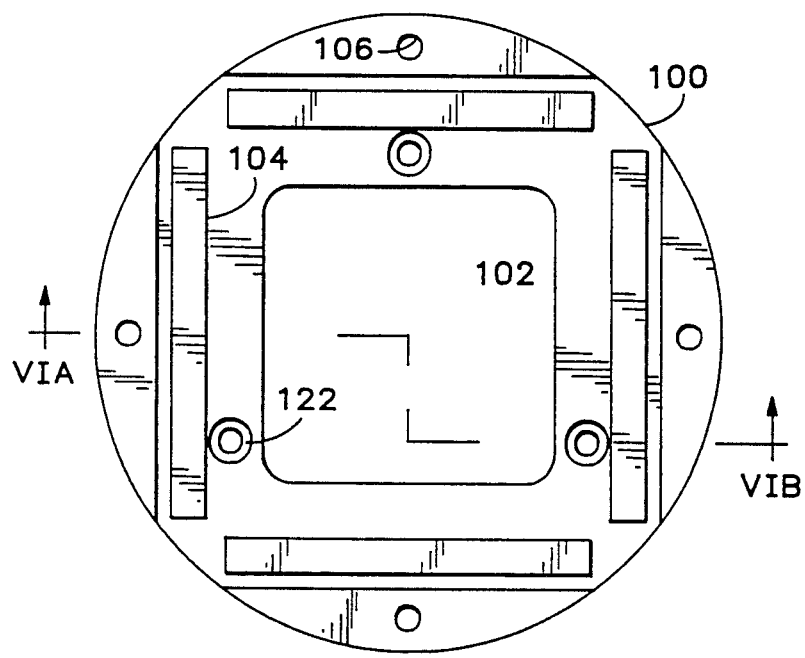

A cover plate 100 is placed over probe head 14. Cover plate 100 is shown in FIG. 5 and in FIGS. 6A and 6B and has a generally square opening 102 that registers with the opening 50 defined by frame 48. When the probe head is fitted in opening 80 of interface board 18, cover plate 100 extends over the upper surface of the interface board. The cover plate has holes 106 to receive screws for securing plate 100 to the interface board. When the cover plate is attached to the interface board, ribs 104 at the underside of plate 100 enter the slots 58 of loading member 46 and compress the neoprene strips 90. Compression of the neoprene strips provides contact force ensuring reliable pressure contact between the contact pads 38 on lips 72 and the contact pads 82 on interface board 18.

The portion of layer 30 (FIGS. 2B and 2D) on each leaf 68 is connected through a via to a contact pad (not shown) on the lower face of sheet 24, which contact pad engages a ground conductor run of interface board 18. Conductor runs 34 are dimensioned so that runs 34 and layer 30 form transmission lines for connecting contact bumps 40 to contact pads 38. It will be appreciated that not all of the conductor runs 34 are signal runs, it being necessary also to provide power and ground connections to the die under test.

Referring again to FIG. 3A, outer frame 48 of loading member 46 is formed with internally threaded holes 120 registering with recesses 122 (FIGS. 6A and 6B) in the underside of cover plate 100. Screws (not shown) are threaded into holes 120 so that their heads are received in recesses 122. By adjusting these screws after cover plate 100 has been secured to interface board 18, the orientation of the plane of the bottom end surfaces 64 of the vertical limbs 56 can be brought into parallel relationship with the top surface of platform 8, for example in order to compensate for warping of board 18.

As noted previously, the upper surface of the horizontal limb 54 of each arm 52 is, at least immediately above vertical limb 56 of that arm, optically clear. Therefore, an operator of the test station, using an appropriate microscope (not shown) can view the contact bumps 40 and the contact pads of a die to be tested through vertical limbs 56 of arms 52 and can ensure that probe head 14 is properly positioned relative to the contact pads of the die. When the platform of the vacuum chuck is raised, contact is made between the contact pads of the die under test and the contact bumps of probe head 14. After initial contact is detected, vacuum chuck 2 is overdriven, i.e. its platform is driven vertically upwards beyond the point of initial contact, by a further distance of about 0.75 microns. This causes deflection of the horizontal limbs 54 of the cantilever arms, and this deflection supplies contact force for maintaining reliable pressure contact between the contact bumps of probe head 14 and the contact pads of the die under test. Further, deflection of the horizontal limbs 54 of the cantilever arms 52 causes horizontal movement of the lower ends of vertical limbs 56, which results in a scrubbing action of contact bumps 40 against the pads of the DUT. This removes foreign material and oxide from the contact pads of the die under test and contributes to a reliable pressure contact being achieved.

Use of cantilever arms 52 provides precise control over the contact force developed per unit overdrive of the vacuum chuck. Since the vertical limbs 56 of the cantilever arms surround a generally square opening, horizontal positioning of the wafer probe can be aided by visual inspection through this passageway. Further, the opening allows internal contact pads of the DUT to be probed and also allows laser trimming of the DUT.

The screws that are used to attach cover plate 100 to interface board 18 preferably include a release mechanism that allows cover plate 100 to move relative to board 18 in the event that the force exerted on the cover plate by the probe head exceeds a predetermined limit, indicating that the chuck has overdriven too far.

It is desirable that the dimensions of outer frame 48 be uniform from probe to probe, and therefore the dimensions of horizontal limb 54 depend on the dimensions of the die under test. The contact force applied at each contact bump by loading member 46 depends on the number of contact bumps and on the dimensions of the horizontal limb 54 of cantilever arm 52. By selection of the thickness of horizontal limb 54, the contact force per bump can be maintained uniform for different sizes of die.

Figure 7:
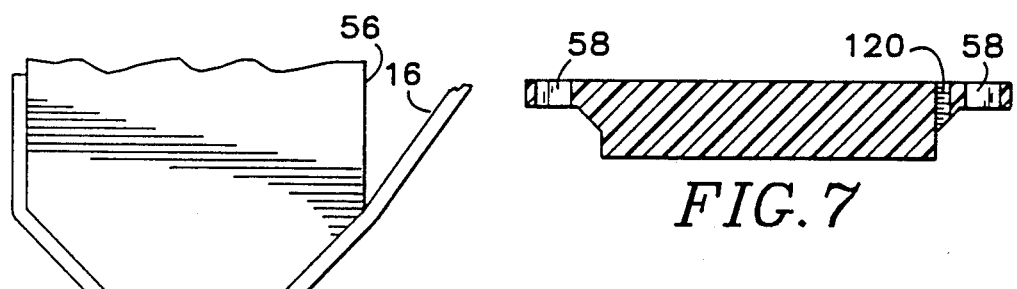
FIG. 7 is a sectional view of a blank used to fabricate the loading member.

In order to facilitate construction of loading members having cantilever arms 52 with different dimensions, loading member 46 is preferably made by injection molding a blank in the form shown in FIG. 7 and then removing material by machining to produce cantilever arms of the desired dimensions. The bottom surface of the blank is planar to within about 0.25 microns, and is optically clear. During the machining operation, the lower surface of the blank is masked in the regions that will ultimately be the bottom end surfaces of the vertical limbs of the cantilever arms, so as to avoid impairing the optical qualities of the surface. Further, the top surfaces of the horizontal limbs are polished after machining to restore their optical qualities. By manufacturing the loading member in this fashion, it is relatively easy to make loading members in which dimensions of the cantilever arms are selectively controlled to ensure that the same bending force is required per contact bump per unit overdrive, within the range of overdrive that is used.

Figure 8:
FIG. 8 is an enlarged sectional view illustrating a detail of the preferred loading member.

Before the cantilever arms are separated from each other, it is desirable that the lower end of the vertical limb of each arm be beveled, as shown in FIG. 8, so that its bottom end surface has two surface portions that are inclined at an acute angle to the plane of the bottom surface of the blank. This avoids the need to bend the leaves through an angle of almost 90 degrees and thus reduces the stress imposed on the leaves.

The probe described with reference to FIGS. 2-8 is designed for use in testing a die that is rectangular and has contact pads along all four sides. However, there are some integrated circuits that are embodied in dies that have contact pads only along two opposite sides. In this case, the loading member need have only two cantilever arms. If only two cantilever arms are required, each arm can be made substantially wider than shown in FIG. 3B, and accordingly the probe head can be provided with sufficient contact bumps and conductor runs on each leaf for testing two or more dies at a time.

Figure 9:
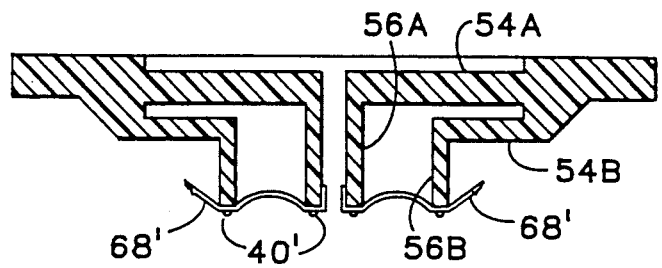
FIG. 9 is a partial sectional view of a modified form of probe head.

In a further development of the probe, shown in FIG. 9, it is possible to test two rows of dies simultaneously. Two cantilever arms, each of a width corresponding to the length of two or more dies, are bifurcated so that each has two horizontal limbs 54A and 54B and two vertical limbs 56A, 56B. The leaves 68' each have two rows of contact bumps 40' spaced apart by a distance that is slightly greater than the distance between the two vertical limbs of one arm. In this manner, a portion of the leaf flexes up between the vertical limbs of the bifurcated arm so that it does not contact the die under test.

It will be appreciated that the invention is not restricted to the particular embodiments that have been described, and that variations may be made therein without departing from the scope of the invention as defined in the appended claims and equivalents thereof. For example, it is not essential that the cantilever arm be composed of a horizontal limb and a vertical limb, and it could comprise a straight beam inclined downward from the outer frame of the loading member.

We claim:

1. A probe head for establishing electrically conductive contact with an electronic device, said probe head comprising:
   a loading member having an attachment portion for attachment to a support structure and a cantilever arm having first and second opposite end regions, the cantilever arm being attached at its first end region to the attachment portion and the second end region of the cantilever arm being spaced from the attachment portion,
   a flexible sheet of insulating material having first and second opposite main faces and first and second opposite end regions, the sheet being attached at its first end region to the second end region of the cantilever arm with the first main face of the flexible sheet confronting the cantilever arm,
   a first array of contact elements exposed at the second main face of the sheet at the first end region thereof, whereby the sheet of insulating material is between the cantilever arm and the contact elements of the first array,
   a second array of contact elements exposed at the second end region of the sheet, and
   conductor runs connecting the contact elements of the first array with respective contact elements of the second array.

2. A probe head according to claim 1, wherein the cantilever arm comprises a first limb having a proximal end and a distal end, the first limb being attached at its proximal end to the attachment portion, and a second limb having a proximal end and a distal end and being attached at its proximal end to the distal end of the first limb, the second limb extending substantially perpendicular to the first limb and constituting said second end region of the cantilever arm.

3. A probe head according to claim 1, wherein said attachment portion comprises a generally rectangular frame composed of first, second, third and fourth side portions lying in a common general plane and defining a generally rectangular opening, and the cantilever arm extends from said first side portion of the frame into the opening defined by the frame.

4. A probe head according to claim 3, wherein the cantilever arm comprises a first limb having a proximal end and a distal end, the first limb being attached at its proximal end to said first side portion of the frame and extending substantially parallel to said general plane, and a second limb having a distal end and a proximal end and being attached at its proximal end to the distal end of the first limb, the second limb extending substantially perpendicular to said general plane and constituting said second end region of the cantilever arm.

5. A probe head according to claim 3, wherein the second side portion of the frame is opposite the first side portion thereof, the loading member further comprises a second cantilever arm having first and second opposite end regions, the second cantilever arm being attached at its first end region to the second side portion of the frame and extending into the opening defined by the frame, and the probe head further comprises a second flexible sheet of insulating material having first and second opposite main faces and first and second opposite end regions, the second sheet being attached at its first end region to the second end region of the second cantilever arm with the first main face of the second sheet confronting the second cantilever arm, a first array of contact elements exposed at the second main face of the second sheet at the first end thereof, whereby the second flexible sheet is between the second cantilever arm and the contact elements of the first array, a second array of contact elements exposed at the second end region of the second sheet, and conductor runs connecting the contact elements of the first array of the second sheet with respective contact elements of the second array of the second sheet.

6. A probe head according to claim 5, wherein the second array of contact elements of the first sheet and the second array of contact elements of the second sheet are exposed at the second main faces of the respective sheets, and the first and second sheets are attached at their respective second end regions to said first and second side portions respectively of the frame.

7. A probe head according to claim 3, wherein the loading member further comprises second, third and fourth cantilever arms each having first and second opposite end regions, the second, third and fourth cantilever arms being attached at their respective first end regions to the second, third and fourth side portions respectively of the frame and the second end region of each cantilever arm being spaced from the respective side portion, and the probe head further comprises second, third and fourth flexible sheets of insulating material each having first and second opposite main faces and first and second opposite end regions, the second, third and fourth sheets being attached at the first end region to the second end regions of the second, third and fourth cantilever arms respectively with the first main face of each flexible sheet confronting the respective cantilever arm, a first array of contact elements exposed at the second main face of each of the second, third and fourth sheets at the first end region thereof, whereby each of the second, third and fourth sheets of insulating material is between the cantilever arm to which it is attached and the first array of contact elements on its second main face, a second array of contact elements exposed at the second end region of each of the first, second, third and fourth sheets, and conductor runs connecting the contact elements of the first array of each of the second, third and fourth sheets with respective contact elements of the second arrays thereof.

8. A probe head according to claim 1, wherein the conductor runs are adhered to the second main face of the insulating sheet and a ground conductor layer is adhered to the first main face of the insulating sheet.

9. A probe head according to claim 1, wherein said flexible sheet is transparent at the first end region thereof and the cantilever arm is transparent at the second end region thereof, whereby the contact elements can be viewed through the cantilever arm and the flexible sheet.

10. A probe head according to claim 1, wherein the cantilever arm is bifurcated and comprises first and second limbs each having a proximal end attached to the attachment portion and a distal end spaced from the attachment portion, and wherein the flexible sheet has a third array of contact elements exposed at the second main face of the sheet at an intermediate region, between its first and second end regions, and is attached at its first region to the distal end of the first limb end at said intermediate region to the distal end of said second limb.

11. Probe apparatus for establishing electrically conductive contact with an electronic device, said probe apparatus comprising a probe head and a probe support, and the probe head comprising:

a loading member having an attachment portion attached to the probe support and a cantilever arm having first and second opposite end regions, the cantilever arm being attached at its first end region to the attachment portion and the second end region of the cantilever arm being spaced from the attachment portion, a flexible sheet of insulating material having first and second opposite main faces and first and second opposite end regions, the sheet being attached at its first end region to the second end region of the cantilever arm with the first main face of the flexible sheet confronting the cantilever arm, a first array of contact elements exposed at the second main face of the sheet at the first end region thereof, whereby the sheet of insulating material is between the cantilever arm and the contact elements of the first array, a second array of contact elements exposed at the second end region of the sheet, and conductor runs connecting the contact elements of the first array with respective contact elements of the second array.

12. Probe apparatus according to claim 11, comprising a clamping member attached to the probe support, said loading member being captive between the clamping member and the probe support.

13. Probe apparatus according to claim 12, wherein the second end region of the flexible sheet extends between the loading member and the probe support.

14. Probe apparatus according to claim 11, wherein the attachment portion of the loading member is formed with an opening through which the second end region of the flexible sheet is exposed, and the apparatus further comprises a resilient member disposed in said opening and engaged by the clamping member, whereby compression of the resilient member supplies force urging the second end region of the flexible sheet into pressure contact with the probe support.

15. Probe apparatus according to claim 11, wherein the probe support comprises a circuit board having contact pads exposed along an edge region of a first main face of the circuit board in a pattern corresponding to the pattern of the contact elements of the second array of the flexible sheet, and the flexible sheet is positioned so that the contact elements of the second array are in direct pressure contact with the contact elements of the circuit board.

16. Probe apparatus according to claim 11, wherein said flexible sheet is transparent at the first end region thereof and the cantilever arm is transparent at the second end region thereof, whereby the contact elements can be viewed through the cantilever arm and the flexible sheet.

17. A probe head for establishing electrically conductive contact with an electronic device, said probe head comprising:

a loading member having an attachment portion for attachment to a support structure and at least first and second cantilever arms, each cantilever arm comprising an elongate deflectable limb having first and second opposite ends spaced apart along the length thereof, the deflectable limb being attached at its first end to the attachment portion and the second end of the deflectable limb being spaced from the attachment portion, and each cantilever arm also comprising a spacer member attached to the deflectable limb at the second end thereof and projecting in a direction transverse to the length of the limb, first and second discrete flexible sheets of insulating material each having first and second opposite main faces and first and second opposite end regions, the first flexible sheet being attached at its first end region to the spacer member of the first cantilever arm with the first main face of the first flexible sheet confronting the first cantilever arm, and the second flexible sheet being attached at its first end region to the spacer member of the second cantilever arm with the first main face of the second flexible sheet confronting the second cantilever arm, a first array of contact elements exposed at the second main face of each flexible sheet at the first end region thereof, whereby the first sheet of insulating material is between the first cantilever arm and the contact elements of the first array of the first sheet and the second sheet of insulating material is between the second cantilever arm and the contact elements of the first array of the second sheet, a second array of contact elements exposed at the second end region of each sheet, and conductor runs connecting the contact elements of the first array of each sheet with respective contact elements of the second array of that sheet.

18. A probe head according to claim 17, wherein said attachment portion comprises a generally rectangular frame composed of first, second, third and fourth side portions lying in a common general plane and defining a generally rectangular opening, the second side portion of the frame being opposite the first side portion thereof, and wherein the first and second cantilever arms are attached to the first and second side portions respectively of the frame, and the second end of the deflectable limb of the first cantilever arm is spaced across said opening from the second end of the deflectable limb of the second cantilever arm.

19. A probe head according to claim 17, wherein the first and second flexible sheets are transparent at the first end region thereof and the first and second cantilever arms are transparent, whereby the first array of contact elements of each flexible sheet can be viewed through the respective cantilever arm and the respective flexible sheet.

* * * * *